United States Patent [19]
Kirlin et al.

[11] Patent Number: 5,536,323
[45] Date of Patent: Jul. 16, 1996

[54] APPARATUS FOR FLASH VAPORIZATION DELIVERY OF REAGENTS

[75] Inventors: Peter S. Kirlin, Bethel; Robin L. Binder, Bethlehem; Robin A. Gardiner, Bethel; Peter V. Buskirk, Newtown; Jiming Zhang, Danbury; Gregory Stauf, New Milford, all of Conn.

[73] Assignee: Advanced Technology Materials, Inc., Danbury, Conn.

[21] Appl. No.: 280,143

[22] Filed: Jul. 25, 1994

Related U.S. Application Data

[63] Continuation of Ser. No. 927,134, Aug. 7, 1992, abandoned, which is a continuation-in-part of Ser. No. 807,807, Dec. 13, 1991, Pat. No. 5,204,314, which is a continuation of Ser. No. 549,389, Jul. 6, 1990, abandoned.

[51] Int. Cl.$^6$ ................................ C23C 16/00
[52] U.S. Cl. ................ 118/726; 261/154; 261/100; 261/104; 261/106; 261/107; 261/DIG. 65; 392/399
[58] Field of Search ................ 118/726; 261/154, 261/100, 106, 107, 104, DIG. 65; 392/399

[56] References Cited

U.S. PATENT DOCUMENTS

| | | | |
|---|---|---|---|
| 476,274 | 6/1892 | Huck | 261/154 |
| 2,490,547 | 12/1949 | Schraner | 392/399 |
| 2,622,184 | 12/1952 | Johneas | 392/399 |
| 2,801,322 | 7/1957 | Weatherill | 392/399 |
| 2,925,329 | 2/1960 | Yost | 392/399 |
| 2,954,330 | 9/1990 | Schmieding et al. | 202/158 |
| 3,190,262 | 6/1965 | Bakish | 118/726 |
| 3,404,873 | 10/1968 | Orens | 261/154 |

(List continued on next page.)

FOREIGN PATENT DOCUMENTS

| | | |
|---|---|---|
| 58571 | 8/1982 | European Pat. Off. . |
| 032833 | 8/1989 | European Pat. Off. . |
| 0331483 | 9/1989 | European Pat. Off. . |
| 370473 | 3/1923 | Germany ........................ 392/399 |
| 58-125633 | 7/1983 | Japan . |

OTHER PUBLICATIONS

"Epitaxial Film Growths of Artificial (Bi–O)/(SR–Ca–Cu–O) Layered Structures," Fujita, J., et al, Apply. Phys. Lett. vol. 54, No. 23 Jun., 1989 pp. 2364–2366.
"High $T_c$ Oxide Superconductors," Maple M. B., Ed., MRS Bulletin, Jan. 1989, pp. 20–21.
"Thin Films of Barium Fluoride Scintillator Deposited By Chemical Vapor Deposition," P. S. Kirlin, et al, Nyc. Inst. and Methods 261–264.
"Chemical Vapor Deposition of $YBa_2Cu_3O_7$ Using Metal Organic Chelates Precursors," Panson, A. J. et al, Appl. Phys. Lett., 53(18), 31 Oct. 1988 pp. 1756–1758.
"Preparation of Yh–Ba–Cu–O Super Conducting Thin Films Using $BaF_2$ As A Buffer Layer," Radpour, F., et al Appl. Phys. Lett., 54(24), 12 Jun. 1989, pp. 2479–2480.

(List continued on next page.)

Primary Examiner—Richard Bueker
Attorney, Agent, or Firm—Steven J. Hultquist; Janet Elliot

[57] ABSTRACT

A process and apparatus for delivering an involatile reagent in gaseous form, wherein an involatile reagent source liquid is flash vaporized on a vaporization matrix structure at elevated temperature. A carrier gas may be flowed past the flash vaporzation matrix structure to yield a carrier gas mixture containing the flash vaporized source reagent. The matrix structure preferably has a high surface-to-volume ratio, and may sutiably comprise a foraminous matrix element such as screen mesh onto which the reagent source liquid is distributed for flash vaporization. The invention is particularly useful for delivery of Group II reagents and compounds and complexes of early transition metals such as zirconium and hafnium, and may be usefully employed with Group II beta-diketonate source layers, e.g., of YBaCuO, BiSrCaCuO, and TlBaCaCuO types, as well as for forming interlayers of Group II metal fluorides between superconductor or gallium arsenide overlayers, and for depositing thin films of photonic and ferroelectric materials, e.g., $BaTiO_3$, $Ba_xSr_{1-x}Nb_2O_6$, and $PbZr_{1-x}Ti_xO_3$.

4 Claims, 5 Drawing Sheets

U.S. PATENT DOCUMENTS

| | | | |
|---|---|---|---|
| 3,520,416 | 7/1970 | Keedwell | 261/104 |
| 3,549,412 | 12/1970 | Frey, Jr. et al. | 126/271 |
| 3,659,402 | 5/1972 | Alliger | 261/100 |
| 3,823,926 | 7/1974 | Bracich | 261/106 |
| 3,894,164 | 7/1975 | Dismukes et al. | 427/248.1 |
| 3,969,449 | 7/1976 | Shires | 261/153 |
| 3,978,272 | 8/1976 | Donley | 126/271 |
| 4,036,915 | 7/1977 | Lucero | 261/154 |
| 4,080,926 | 3/1978 | Platakis et al. | 118/726 |
| 4,288,396 | 9/1981 | Ottestad | 261/107 |
| 4,501,602 | 2/1985 | Miller et al. | 427/166 |
| 4,529,427 | 7/1985 | French | 427/163 |
| 4,732,110 | 3/1988 | Parsons | 118/719 |
| 4,735,852 | 4/1988 | Osada | 428/336 |
| 4,804,649 | 2/1989 | Sherif | 505/1 |
| 4,842,893 | 6/1989 | Yializis | 427/44 |
| 4,845,308 | 7/1989 | Womack, Jr. et al. | 174/15.4 |
| 4,847,469 | 7/1989 | Hofmann | 219/273 |
| 4,882,312 | 11/1989 | Mogro-Campero | 126/271 |
| 4,883,976 | 5/1989 | Magnus | |
| 4,908,348 | 3/1990 | Hung et al. | 505/1 |
| 4,915,988 | 4/1990 | Erbil | 427/252 |
| 4,931,425 | 6/1990 | Kimura et al. | 427/255.3 |
| 4,935,385 | 6/1990 | Biegelsen | 437/111 |
| 4,940,693 | 7/1990 | Shappiro et al. | 505/1 |
| 4,954,371 | 9/1990 | Yializis | 427/44 |
| 5,097,800 | 3/1992 | Shaw | 118/724 |
| 5,204,314 | 4/1993 | Kirlin et al. | |
| 5,259,995 | 11/1993 | Metalis | 261/107 |

OTHER PUBLICATIONS

"Organometallic Chemical Vapor Deposition of High $T_c$ Superconducting Films Using a Violatile, Fluoro Carbon–Based Precursor," Zhao, J., et al, Appl. Phys. Lett., 53(18), 31 Oct. 1988 pp. 1750–1752.

Webster's New Collegiate Dictionary ©1975 G+C Merriam Co. pp. 709 and 448.

APPARATUS FOR FLASH VAPORIZATION DELIVERY OF REAGENTS

GOVERNMENT RIGHTS IN INVENTION

This invention was made with Government support under Contract No. N00014-88-C-0531 awarded by the Defense Advanced Projects Research Agency (DARPA). The Government has certain rights in this invention.

This is a File Wrapper Continuation of U.S. application Ser. No. 07/927,134, filed on Aug. 7, 1992, which in turn is a continuation-in-part of U.S. application Ser. No. 07/807,807 filed Dec. 13, 1991 in the names of Peter S. Kirlin, Robin L. Binder, and Robin A. Gardiner and issued Apr. 20, 1993 as U.S. Pat. No. 5,204,314, which is a continuation of U.S. application Ser. No. 07/549,389 filed Jul. 6, 1990 in the same names, now abandoned.

BACKGROUND OF THE INVENTION

1. Field of the Invention

This invention relates to an apparatus and method for delivering reagents in a form suitable for introduction into a deposition zone wherein films or layers are formed on a substrate by decomposition of the reagent.

2. Description of the Related Art

Recently many refractory materials have been identified as having unique materials properties. The recently discovered high temperature superconducting (HTSC) materials include $YBa_2Cu_3O_x$, wherein x is from about 6 to 7.3, BiSrCaCuO, and TlBaCaCO. Barium titanate, $BaTiO_3$, has been identified as a ferroelectric and photonic material with unique and potentially very useful properties. $Ba_xSr_{1-x}Nb_2O_6$ is a photonic material whose index of refraction changes as a function of electric field and also as a function of the intensity of light upon it. Lead zirconate titanate, $PbZr_{1-x}Ti_xO_3$, is a ferroelectric material whose properties are very interesting. The Group II metal fluroides, $BaF_2$, $CaF_2$, and $SrF_2$, are materials that are useful for scintillation detecting and coating of optical fibers.

Many of the potential applications of these materials require their use in thin film, coating, or layer form. The films or layers may also be advantageously epitaxially related to the substrate upon which they are formed. Applications in which the refractory materials may need to be deposited in film or layer form include integrated circuits, switches, radiation detectors, thin film capacitors, holographic storage media, and various other microelectronic devices.

Uses that are currently envisioned for the copper oxide superconductors include high speed switches, bolometers, and high frequency communications components such as mixers. These applications would desirably use the HTSC material in the form of thin films in devices that can be made using well-known microelectronic fabrication technology.

Thin films comprising the Group II metal fluorides, $BaF_2$, $CaF_2$, and $SrF_2$, are potentially very useful as buffer layers for interfacing between silicon substrates and HTSC or GaAs over-layers or between GaAs substrates and HTSC or silicon overlayers, and combinations of two or all of such metal fluorides may be employed in forming graded compositions in interlayers providing close lattice matching at the interfaces with the substrate and overlayer constituents of the composite. For example, a silicon substrate could be coated with an epitaxial layer of $BaF_2/CaF_2$, $SrF_2/CaF_2$, or $SrF_2/CaF_2/BaF_2$, whose composition is tailored for a close lattice match to the silicon. If the ratio of the respective Group II metal species in the metal fluoride interlayers can be controlled precisely in the growth of the interlayer, the lattice constant could be graded to approach the lattice constant of GaAs. Thus, a gallium arsenide epitaxial layer could be grown over the metal fluoride interlayer, allowing the production of integrated GaAs devices on widely available, high quality silicon substrates. Another potential use of such type of metal fluoride interlayers would be as buffers between silicon substrates and polycrystalline HTSC films for applications such as non-equilibrium infrared detectors. Such an interlayer would permit the HTSC to be used in monolithic integrated circuits on silicon substrates.

$BaTiO_3$ and $Ba_xSr_{1-x}Nb_2O_6$ in film or epitaxial layer form are useful in photonic applications such as optical switching, holographic memory storage, and sensors. In these applications, the $BaTiO_3$ or $Ba_xSr_{1-x}Nb_2O_6$ film is the active element. The related ferroelectric material $PbZr_{1-x}Ti_xO_3$ is potentially useful in infrared detectors and thin film capacitors well as filters and phase shifters.

Chemical vapor deposition (CVD) is a particularly attractive method for forming these layers because it is readily scaled up to production runs and because the electronics industry has a wide experience and an established equipment base in the use of CVD technology which can be applied to new CVD processes. In general, the control of key variables such as stoichiometry and film thickness, and the coating of a wide variety of substrate geometries is possible with CVD. Forming the thin films by CVD will permit the integration of these materials into existing device production technologies. CVD also permits the formation of layers of the refractory materials that are epitaxially related to substrates having close crystal structures.

CVD requires that the element source reagents must be sufficiently volatile to permit gas phase transport into the deposition reactor. The element source reagent must decompose in the reactor to deposit only the desired element at the desired growth temperatures. Premature gas phase reactions leading to particulate formation must not occur, nor should the source reagent decompose in the lines before reaching the reactor deposition chamber. When compounds, especially the HTSC materials, are desired to be deposited, obtaining optimal properties requires close control of stoichiometry which can be achieved if the reagent can be delivered into the reactor in a controllable fashion. Close control of stoichiometry would also be desired, for example, in the application described above involving graded Group II metal fluoride interlayers.

Many potentially highly useful refractory materials have in common that one or more of their components are elements, such as the Group II metals barium, calcium, and strontium, or early transition metals such as zirconium or hafnium, for which no volatile compounds well-suited for CVD are known. In many cases, the source reagents are solids which can be sublimed for gas-phase transport into the reactor. However, the sublimation temperature may be very close to the decomposition temperature, in which case the reagent may begin to decompose in the lines before reaching the reactor, and it will be very difficult to control the stoichiometry of the deposited films.

The formation of multicomponent refractory and electronic thin films such as high temperature superconductors [see K. Shinohara, F. Munakata, and M. Yamanaka, *Jpn. J. Appl. Phys.* 27, L1683 (1988); and K. Zhang, E. P. Boyd, B. S. Kwak, and A. Erbil, *Appl. Phys. Lett.* 55, 1258 (1989)] and ferroelectrics [see C. J. Brierley, C. Trundle, L. Considine, R. W. Whatmore, and F. W. Ainger, *Ferroelectrics* 91, 181 (1989); and F. W. Ainger, C. J. Brierley, M. D. Hudson, C. Trundle, and R. W. Whatmore, *Ferroelectric Thin Films*, E. R. Myers and A. I. Kingdon, Eds., Materials Research Society, Pittsburgh, Pa., 1990] by CVD or metalorganic CVD (MOCVD) has been only marginally successful. These materials have placed new demands on CVD technology, with the primary stumbling blocks being the inability to achieve exacting control of the stoichiometry of the multi-component films and the absence of volatile source reagents. In many instances the source reagents are solids which decompose at temperatures near or slightly above the temperature at which they sublime.

Organogroup I and II complexes are particularly problematic. With the use of conventional bubblers, the bubbler is held at a temperature sufficiently high to sublime the reagent and consequently significant and somewhat variable decomposition of the source reagents occurs during a single growth run. This premature decomposition causes variations in the composition as a function of thickness in the as-deposited films and poor reproducibility in film stoichiometry between different growth runs.

Inexacting compositional control is particularly deleterious to high temperature superconducting thin films because the superconducting properties are extremely sensitive to the stoichiometry of the layer [see K. Wasa, H. Adachi, Y. Ichikawa, K. Setsune, and K. Hirochi, *Review Solid State Sci.* 2, 453 (1988); and R. F. Bunshsh, and C. V. Deshpandey, *Research and Development* 65 (1989)]. Two approaches involving the use of nonconventional hardware have been tried to overcome this problem. The first method eliminates the bubblers and uses a reactor tube which contains concentric tubes, each containing a boat filled with a single source reagent. A temperature gradient is applied along the tube to vaporize each material at the required temperature [see M. Ihara, T. Kimura, H. Yamawaki, and K. Ikeda, *IEEE Trans. Magnetics* 25, 2471 (1989); and H. Yamane, H. Kurosawa, T. Hirai, K. Watanabe, H. Iwasaki, N. Kobayashi, and Y. Muto, *J. Crystal Growth* 98, 860 (1989)]. There are several drawbacks to this method: (1) as with standard bubblers, significant decomposition occurs during a given run because the reagents are held at high temperatures for the duration of the run; (2) temperature control is not as good as with standard bubblers, thus giving rise to wide variations in source reagent vapor pressure and consequently to wide variations in the stoichiometry of the as-deposited films, and (3) the boats need to be charged before each run, a step which is not consistent with a high volume commercial process.

The second method uses two bubblers in series. The first bubbler contains a volatile chelating ligand which presumably acts to stabilize and/or to lower the melting point of the source reagent which is contained in the second (downstream) bubbler, [see P. H. Dickinson, T. H. Geballe, A. Sanjurjo, D. Hildenbrand, G. Craig, M. Zisk, J. Collman, S. A. Banning, and R. E. Sievers, *J. Appl. Phys,* 66 444 (1989)]. Stabilities on the order of a few hours which are sufficient for a single run have been realized with this method. However, a fresh charge of source reagent is needed before each run. In addition, some enhancement in the vapor pressure of the source reagent occurs. Unfortunately, the amount of enhancement is not reproducible, which again causes variations in the stoichiometry of the as-deposited films.

Standard CVD processes, such as the deposition of tungsten metallization layers from tungsten hexafluoride and silane [see R. S. Rosler, J. Mendonca, M. J. Rice, Jr., *J. Vac,* *Sci. Technol.*, B6, 1721 (1988)], which use gaseous or liquid source reagents, are not plagued by source reagent decomposition. Furthermore, deposition conditions (i.e., substrate temperature, reactor pressure, and partial pressures of the source reagents) can typically be found where the growth of the desired phase is kinetically or thermodynamically favored over individual impurity phases. For example, the MOCVD of single crystal GaAs thin films is carried out with an arsine+trimethylgallium mixture in which there is typically a 30 to 60-fold excess of the group V source reagent Under appropriately selected conditions, the excess arsine either does not react or the extra arsenic evaporates before it can be incorporated into the growing film [see T. F. Kuech, *Mat. Sci. Reports*, S. S. Lau and F. W. Saris, Eds 2, 1 (1987)].

By contrast, during CVD processes for refractory materials, the vapor pressures of the binary oxides, nitrides, and carbides are often lower than that of the desired multicomponent phase at the deposition temperature. Thus any excess source reagent leads to the deposition of a binary oxide or carbide which is then incorporated as an impurity phase in the growing film.

In summary, the techniques heretofore employed for formation of refractory thin films from relatively involatile reagents have not permitted efficient delivery of the reagents into the reactor and close control of reagent ratios and hence film stoichiometry.

Other objects and advantages of the present invention will be more fully apparent from the ensuing disclosure and appended claims.

SUMMARY OF THE INVENTION

In one aspect, the present invention relates to an apparatus for forming a vapor of an involatile reagent, comprising:

a reservoir for supplying an involatile reagent source liquid;

a flash vaporization matrix structure;

means for heating the flash vaporization matrix structure to a temperature sufficient to flash vaporize reagent source liquid thereon; and means for delivering reagent source liquid from the reservoir to the flash vaporization matrix structure for contact with the surface thereof.

The apparatus may additionally comprise means for flowing a carrier gas past the flash vaporization matrix structure to yielding a carrier gas mixture containing flash vaporized reagent source solution.

As used herein, term "involatile reagent" refers to a solid or liquid material which has a low or negligible vapor pressure, e.g., less than about 0.1 torr at standard temperature and pressure (25° C., 1 atmosphere) conditions, but which is vaporizable by flash vaporization at elevated temperature.

As used herein, the term "flash vaporization" used in reference to the involatile reagent means vaporization of the involatile reagent wherein the period of time during which the vaporization takes place is sufficiently short so that the concentration of the vapor formed from the involatile reagent in the vaporization zone does not vary.

In a still further aspect, the invention may utilize as a solvent for the involatile reagent a liquid having an extremely low volatility, and which is non-flash vaporized under the conditions which are flash-vaporizingly effective for the involatile reagent. Under such circumstances, the non-vaporized or fraction of non-vaporized solvent may be recollected at the locus of flash vaporization and recycled for recombination with involatile reagent to form the reagent source liquid, as a solution of the solvent and involatile reagent.

Other aspects and features of the invention will be more fully apparent from the ensuing disclosure and appended claims.

DETAILED DESCRIPTION OF THE INVENTION, AND PREFERRED EMBODIMENTS THEREOF

The present invention is based on the discovery that various elements, such as the Group II metals barium, calcium, and strontum, and early transition metals such as zirconium and hafnium, for which no volatile compounds well-suited for CVD are known, may nonetheless be provided for CVD applications by (1) flash vaporizing involatile compounds thereof, or (2) dissolving involatile compounds of such elements in a suitable solvent and then flash vaporizing the resulting source reagent solution, on a suitable vaporization matrix structure.

By such expedient, close control of stoichiometry can be achieved, such as is for example critical when source materials are deposited in the formation of HTSC material films.

Figure 1:
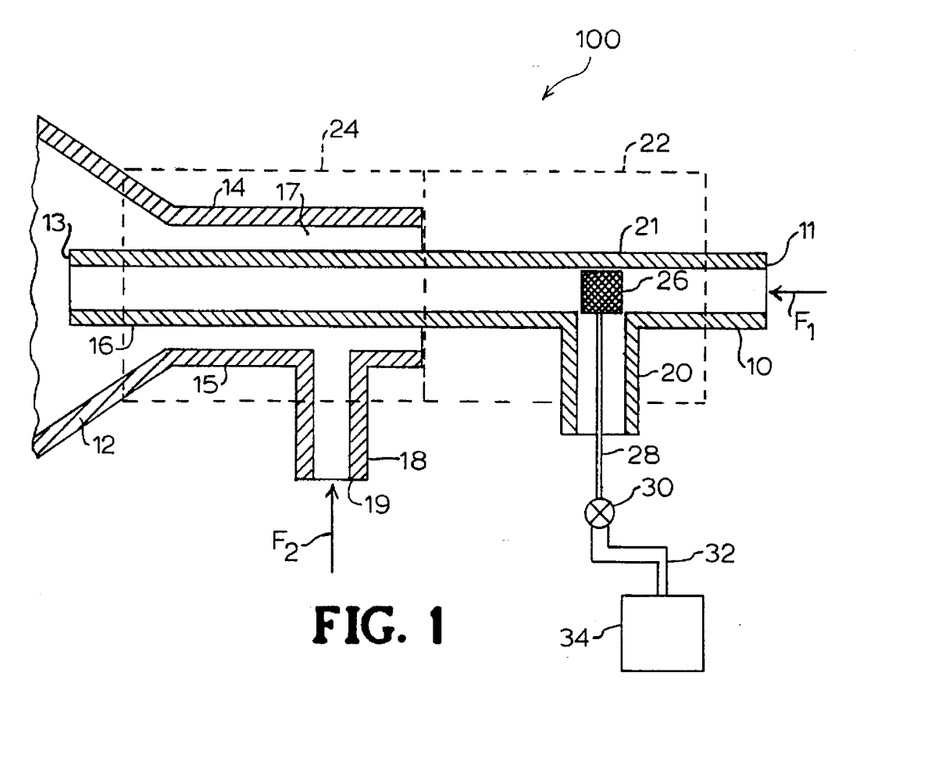
FIG. 1 is a schematic representation of a delivery system for flash vaporizing a source reagent.

Referring now to the drawings, FIG. 1 shows a schematic representation of a delivery system 100 for an involatile reagent.

The delivery system includes a first fluid feed passage 10 into which a first fluid is introduced in the direction indicated by arrow $F_1$. The first fluid may comprise a carrier gas, such as argon, as well as other gaseous components, e.g., volatile source compounds for elements such as copper, yttrium, etc.

The first fluid feed passage 10 is connected to a gas distribution manifold at its proximal end 11, and is open at its distal end 13. The distal portion 16 of passage 10 is mounted in a housing 12 of a reactor, such as a CVD growth chamber. The distal portion 16 of the first fluid feed passage 10 thus is centrally disposed in the cylindrical portion 15 of the reactor 12, to form an annular interior volume 17 therebetween.

Communicating with the annular interior volume 17 is a second fluid flow passage 18, into which second fluid is introduced in the direction indicated by arrow $F_2$, through the open end 19 of the passage. The second fluid introduced in passage 18 to the reactor may include other source reagent materials, or components or carrier gas species, such as oxygen and argon in the case of HTSC film formation systems.

Disposed in the proximal portion 21 of the first fluid flow passage 10 is a flash vaporization matrix structure 26, which is joined in liquid delivery relationship by conduit 28 and conduit 32, having check valve 30 therebetween, to liquid reservoir 34. Conduit 28 is sized and arranged (mounted on flash vaporization matrix structure 26) in such manner as to prevent premature evaporation of any volatile components (e.g., solvent constituents) of the source liquid flowed through conduit 28 to the vaporization matrix structure for flash vaporization thereon. The conduit 28 extends through lateral extension 20 of first fluid flow passage 10. Liquid reservoir 34 is constructed and arranged to hold a reagent source liquid, e.g., a solution comprising an involatile reagent and a suitable solvent therefor, or if the involatile reagent is a suitable liquid, then the involatile reagent alone.

The delivery system 100 shown in FIG. 1 comprises a vaporization zone 22, which may be maintained at a suitable elevated temperature commensurate with the flash vaporization of reagent source liquid on the flash vaporization matrix structure 26.

Downstream from the vaporization zone 22 is an injection zone 24, wherein the second fluid is introduced via second fluid flow passage 18. The injection zone 24 is maintained at a suitable temperature, which may be somewhat less than the temperature of the vaporization zone, depending on the various constituents introduced through the respective first and second fluid flow feed passages.

In operation, the first fluid is flowed in the direction $F_1$ through first fluid flow passage 10 into the reactor 12, being discharged at the distal open end 13 of the first fluid flow passage 10. Concurrently with such flow of gas therethrough, the reagent source liquid from reservoir 34 is flowed through conduit 32, check valve 30, and conduit 28, to the flash vaporization matrix structure 26.

The flash vaporization matrix structure 26 may be formed of any suitable material which does not deleteriously interact with the reagent source liquid or other fluid species introduced into the first fluid flow passage. The matrix structure should also be heatable to sufficient elevated temperature to effect flash vaporization of the reagent source liquid which is introduced from conduit 28 onto the surfaces of the matrix structure. The matrix structure may for example be formed of metals such as stainless steel, copper, silver, iridium, platinum, etc., as well as ceramics, high temperature glasses, composite materials, and the like, the choice of a specific material of construction being dependent on the temperature regime which is encountered by the matrix structure, as well as the composition of the reagent source liquid and fluid flowed past the structure in the first fluid flow passage 10. Preferably, the matrix structure is constructed of an inert metal, and has a relatively high surface-to-volume ratio, as for example at least about 4, when the surface and volume are measured in corresponding area and volume dimensional units (viz., square and cubic values of the same dimensional units). Preferably the matrix structure is foraminous (i.e., porous or perforate) in character.

The flash vaporization matrix structure may take the form of a screen, porous sintered material body, grid, or the like, as described hereinafter in greater detail. The composition, surface area, and surface-to-volume characteristics of the matrix structure are selected so as to effect flash vaporization of the involatile reagent source liquid on the surfaces of the structure, near contemporaneously with application of liquid thereon.

The conduit 28 introducing the reagent source liquid onto the matrix structure 26 may simply be an open-ended tube, i.e., a tube whose open end communicates with the matrix structure, whereby liquid issuing from the conduit flows onto the surfaces of the matrix structure for flash vaporization thereon, when the grid is heated to suitable elevated temperature. As previously discussed, conduit 28 is appropriately sized and arranged relative to the vaporization matrix structure 26 to prevent any undesirable premature evaporation of the reagent source liquid before the flash vaporization thereof on the matrix structure.

In order to enhance the dispersion and distribution of reagent solution onto the surfaces of the matrix structure, the conduit 28 may have a restriction rod (not shown) centrally disposed therein to form an interior annular conduit, whereby pressure drop in the conduit is increased to a desired level, and whereby liquid issues in a thin film onto the matrix structure surfaces. Alternatively, the conduit 28 may be joined to a suitable nozzle or distributor means (not shown) at the distal end of the conduit, to facilitate distribution of reagent source liquid onto the matrix structure surfaces.

The reagent solution reservoir 34 may be associated or otherwise coupled with a suitable liquid pumping means (not shown), such as a positive displacement liquid pump which effects discharge of reagent source liquid from the reservoir through conduit 32, check valve 30, and conduit 28 to the matrix structure 26. The reagent source liquid may be introduced onto the vaporization matrix structure in a steady stream injection mode or in a pulsed injection mode from the conduit 28. In general, steady stream injection of the reagent source liquid is desirable in CVD applications since it provides the most stable concentration of the source reagent in the downstream reactor, however pulsed injection of the reagent source liquid may be advantageous in some applications.

Preferably, the matrix structure 26 is formed of a material of construction having a high specific heat capacity, so that the structure is substantially unaffected by heat of vaporization effects, whereby the matrix structure is suitably maintained at a desirable elevated temperature for continuous operation and vaporization of the reagent source liquid. Materials of construction which may contaminate the deposited films sought to be formed from the source reagent liquid, e.g., iron, should be avoided in the practice of the invention, in applications where the composition and stoichiometry of the deposited film are critical.

The check valve 30 between conduits 28 and 32 controls the on/off flow of reagent source liquid therethrough to the matrix structure 26 and is required to prevent the uncontrolled delivery of the source reagent solution to the matrix structure 26 under reduced pressure operating conditions.

The reagent source liquid delivered to the heated matrix structure 26 is vaporized and then carried by a first fluid (carrier gas) into the deposition reaction chamber 12. The first fluid may also comprise other reagents from various upstream bubblers or other source means therefor.

Figure 2:
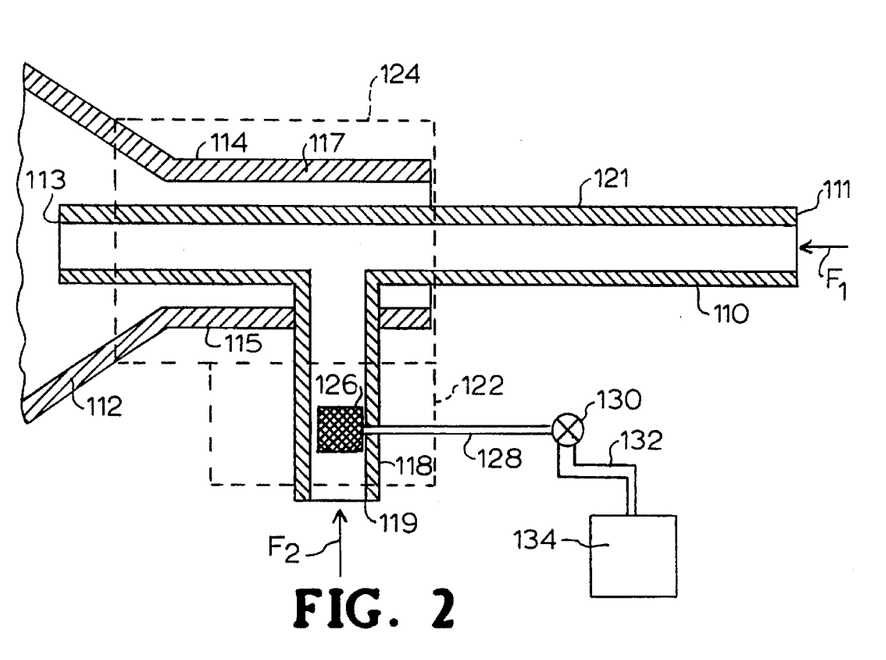
FIG. 2 is a schematic representation of another delivery system for flash vaporizing a source reagent.

FIG. 2 is a schematic representation of another delivery system for flash vaporizing an involatile reagent, which is numbered correspondingly with respect to FIG. 1, by addition of 100 to all reference numerals of corresponding parts and elements of the FIG. 1 system.

The FIG. 2 system is constructed and arranged correspondingly to the FIG. 1 system, with the exception that the vaporization matrix structure 126 is disposed in the second fluid flow passage 118 in the FIG. 2 system, rather than being disposed in the proximal portion of the first fluid flow passage as shown and described with respect to the FIG. 1 system. In connection with such difference, the first fluid flow passage 110 in the FIG. 2 system does not have a lateral extension at the proximal end of the first fluid flow passage, as does the FIG. 1 system. By the arrangement shown in FIG. 2, the flash-vaporized reagent source liquid flows with the gas introduced into second fluid flow passage 118, to the annular interior volume 117 and to the housing 112 of a reactor, e.g., a CVD growth chamber. The second fluid which is introduced in second fluid flow passage 118 to the reactor may include any suitable source reagent materials, components, or carrier gas species, as previously described in connection with FIG. 1. In all other respects, the FIG. 2 system may be operated correspondingly to the FIG. 1 system, to provide the flash-vaporized involatile reagent to the desired processing locus.

The delivery system embodiments illustratively described hereinabove can be used with any deposition reactor configuration and heating method. Examples of suitable deposition reactor and heating modalities include horizontal reactors with infrared (IR) heating, vertical reactors with resistive heating, and vertical reactors with inductive heating.

The delivery system of the present invention is broadly applicable to application of flash vaporized involatile reagent materials to substrates by MOCVD, plasma enhanced chemical vapor deposition (PECVD), photoassisted-CVD, other forms of assisted-CVD, and conventional thermal CVD, with the choice of the specific deposition technique being within the skill of the art, as regards any particular film formation application.

The invention is broadly useful for the deposition of films from source reagents whose decomposition temperatures are close to their sublimation temperatures. The source reagent in the delivery system of the present invention is only required to be at its vaporization temperature for a brief instant. Prior to its vaporization, the reagent source liquid can be maintained at room temperature, with refrigeration of the reagent liquid reservoir being possible (and in some cases desirable).

As a result of such flash vaporization capability, the delivery system of the present invention effectively minimizes the heat required in the provision of the reagent in gaseous form to the deposition (growth) chamber.

The involatile reagent source liquid in the broad practice of the present invention may consist essentially of only the involatile reagent itself, when same is in the form of a low volatility liquid. Such "neat" liquid is introduced to the vaporization matrix structure to form the involatile reagent vapor which then is flowed to the desired use locus. It may also be feasible in the broad practice of the present invention to effectively utilize two or more involatile reagent species, which in combination with one another form a suitable source liquid, such as where a first, solid involatile reagent is soluble in a second, liquid involatile reagent.

Alternatively, and more typically, a solid involatile reagent is dissolved in a non-reagent solvent to form a reagent source liquid solution, which then is flash vaporized on the flash vaporization matrix structure for subsequent delivery to the locus of use.

It is also within the purview of the invention to provide a plurality of involatile reagent species in a suitable solvent medium to form a source liquid solution. Regardless of the number of involatile reagent species employed, the solvent medium may be widely varied, and may comprise single component solvents as well as multicomponent solvent mixtures, with the choice of a specific solvent medium being readily determinable for a given involatile reagent or reagents, and the specific flash vaporization apparatus and flash vaporization conditions employed.

It is also within the broad purview of the present invention to utilize a solution of an involatile reagent as the source liquid for flash vaporization, wherein the solvent has an extremely low volatility such that it is not vaporized during the flash vaporization of the involatile reagent from the solution, but remains in the liquid state. In this manner, the source liquid introduction means and the flash vaporization matrix structure may be arranged and operated so that the non-vaporized solvent is collected at or proximate to the site of flash vaporization, and recirculated for reuse. The advantage of such arrangement and operation of the system is that the solvent medium does not become associated with the flash vaporized involatile reagent, and thus is not carried with the vapor-phase reagent into the downstream reactor or other downstream processing locus, such as is the case when the solvent is co-flashed with the involatile reagent. By utilizing a solvent which is non-vaporized on the vaporization matrix in CVD applications, the solvent is not carried into the deposition reactor where it could otherwise contaminate the growing film. As an example, in plasma enhanced CVD growth, contamination of the growing film by an organic solvent may create problems which render the product film deficient or even useless for its intended purpose.

An illustrative example of a non-flashing low volatility solvent which may be usefully employed in the broad practice of the present invention is the perfluorinated ether commercially available under the trademark Krytox®, which may be employed for example with a tetraglyme adduct dissolved therein to provide the reagent source liquid for flash vaporization.

When a solvent is employed to dissolve the involatile reagent and form a reagent source solution thereof for subsequent flash vaporization of the involatile reagent, the solvent must meet certain criteria. When the solvent is to be co-flashed with the involatile reagent, the solvent medium should be more volatile than the source reagent itself. In such case, the solvent medium should not react with the reagent to form a less volatile product. With respect to the interaction between the solvent and the involatile reagent, three vaporization scenarios are possible, in order of decreasing solvent flashing effectiveness:

(1) The solvent forms an adduct with the molecule of interest, the adduct having enhanced volatility;

(2) The solvent strongly associates with the molecule of interest, and forms a non-ideal gas during vaporization, thereby increasing the effective vapor pressure of the source reagent; and (3) The solvent only weakly interacts with the source reagent, and these two species co-vaporize with little or no enhancement of the vapor pressure of the molecule of interest.

Alternatively, a fourth scenario appropriately describes the use of a non-flashing low volatility solvent:

(4) The solvent only weakly interacts with the source reagent, so that the source reagent is vaporized with little or no enhancement of the vapor pressure of the molecule of interest, but the solvent has extremely low volatility and remains in the liquid state, or else quickly recondenses in proximity to the flash vaporization matrix structure, so that the solvent may be readily collected for reuse in the system.

The specific choice of solvent for a given reagent deposition application will depend on the composition of the reagent and solubility of the reagent in the selected solvent. The choice of a specific solvent thus may be made without undue experimentation by those skilled in the art, based on simple compatibility, solubility, and vaporization tests.

Depending on the identity of the specific reagent compound to be dissolved therein and subsequently flash vaporized, potentially usefully employed co-flash vaporizable solvents in the broad practice of the present invention include alkanolic solvents and alcohols generally, as well as ethers, and amines. The solvent should not contain any materials, or decompose to form any materials, which deleteriously contaminate the films or layers deposited from the vaporized source reagent solution. For this purpose, sulfoxide solvents should not be used in the formation of HTSC layers on substrates, since the sulfoxide solvent will contaminate the resulting HTSC film. When the solvent is to be maintained in the liquid phase while the involatile reagent is flash vaporized from a reagent source liquid containing the involatile reagent, halogenated organic solvents such as the Krytox® perfluorinated ether may be employed, as previously discussed.

Although the involatile reagent delivery system of the invention has been described with reference to the embodiments of FIGS. 1 and 2, as involving a carrier gas with which the flash vaporized involatile reagent is mixed to form a resulting source gas mixture for subsequent processing, it is within the broad purview of the present invention to operate without the provision of any carrier gas, so that the flash vaporized material is flowed without any additional components or materials to the downstream treatment or processing locus. This may be effected by operating a downstream processing chamber, e.g., a CVD growth reactor, at a pressure below that of the flash vaporization chamber, so that the flashed vapor flows under the differential pressure conditions from the vaporization chamber to the downstream processing chamber.

The involatile reagent employed in the broad practice of the present invention may be of any of widely varying types, depending on solvent employed and the specific end use application for which the reagent is intended.

Potentially useful involatile reagents in the broad practice of the present invention include Group II reagents, such as organometallic compounds and complexes of Group II elements.

By way of example, in the formation of Group II metal fluoride (e.g., $BaF_2/CaF_2/SrF_2$) interlayers, between silicon substrates and HTSC or GaAs overlayers, suitable Group II involatile source reagents may comprise: barium 1,1,1,2,2, 3,3-heptafluoro-7,7-dimethyl-octane-4,6-dionate, hereafter denoted $Ba(fod)_2$; calcium 1,1,1,2,2,3,3-heptafluoro-7,7-dimethyl-octane-4,6-dionate, hereafter denoted $Ca(fod)_2$; strontium 1,1,1,2,2,3,3-heptafluoro-7,7-dimethyl-octane-4,6-dionate, hereafter denoted $Sa(fod)_2$; hexafluroacetylacetonate compounds of barium, calcium, and strontium; and adducts of such hexafluoroacetylacetonate compounds with tetraglyme.

In the formation of HTSC films of BiSrCaCuO by MOCVD, wherein the strontium and calcium reagents are introduced as vaporized reagent solutions of the materials, the calcium involatile reagent may be $Ca(fod)_2$ and the strontium reagent may be $Sr(fod)_2$.

$Ba(fod)_2$; barium hexafluroacetylacetonate; barium hexafluroacetylacetonate/tetraglyme adduct; 1,2,3,4,5-pentamethyl-1,3-cyclopentadienyl barium; and barium bis(2, 2,6,6-tetramethyl-3,5-heptanedione) may suitably be employed as involatile Group II reagents for barium in the MOCVD formation of HTSC films of the "123" type ($YBa_2Cu_3O_x$, wherein x is from about 6.0 to about 7.3).

The present invention is generally applicable to the delivery of Group II elements from Group II beta-diketonate source reagent compounds, including the aforementioned Ba(fod)$_2$, Ca(fod)$_2$, and Sr(fod)$_2$ compounds. For the Group II beta-diketonate source reagent compounds, alcohols generally are preferred as solvent species, particularly alkanolic solvents, e.g., isopropanol, butanol, and the like.

Figure 3:
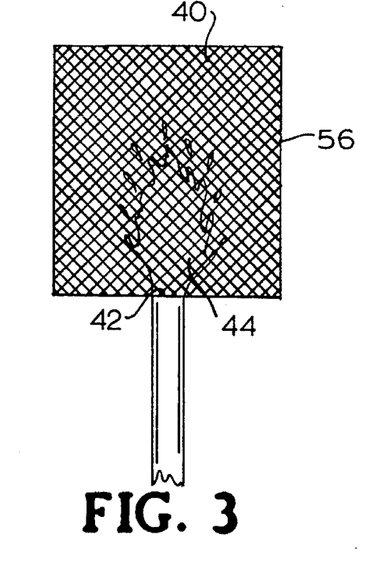
FIG. 3 is a front elevation view of a flash vaporization matrix structure of the FIG. 1 system.

FIG. 3 is a front elevation view of the flash vaporization matrix structure 26 which is shown in FIG. 1, as associated with reagent source liquid feed conduit 28. The matrix structure 26 may suitably comprise a screen 40 formed of criss-crossed wire strands yielding a foraminous structure, to which the distal end 42 of reagent source liquid feed conduit 28 is suitably attached, e.g., by welding, brazing, or the like. In such manner, fluid flow communication is provided between the interior passage of conduit 28 and the matrix structure 26, to effect flow of liquid 44 from the conduit onto the surfaces of the matrix structure 26, for vaporization of the reagent source liquid thereon.

Figure 4:
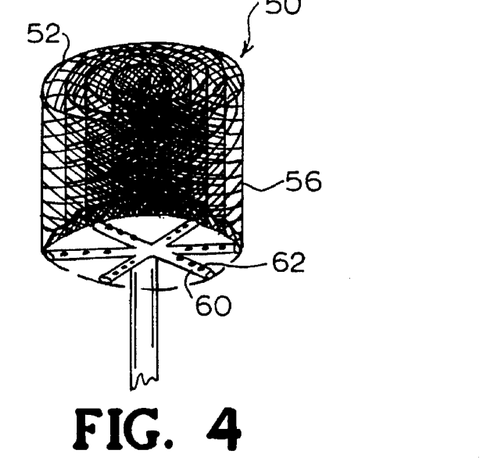
FIG. 4 is a perspective view of an alternative flash vaporization matrix structure.

FIG. 4 shows a perspective view of another flash vaporization matrix structure assembly 50, comprising a spiral wound screen 52, to the lower end 54 of which is joined a liquid distributor 56, which in turn is joined to and fed by reagent source liquid feed conduit 58. The distributor assembly 56 comprises a series of radially extending arms 60, which in turn have liquid flow openings 62 on their upper portions, to accommodate discharge of liquid therethrough, as supplied by the feed conduit 58.

In operation of the FIG. 4 assembly, reagent source liquid flows through feed conduit 58 into the arms 60 of the distributor assembly 56 and is discharged through openings 62 in the form of fine jets of liquid onto the surfaces of the screen mesh 52 which is at elevated temperature, for vaporization on the surfaces thereof.

Figure 5:
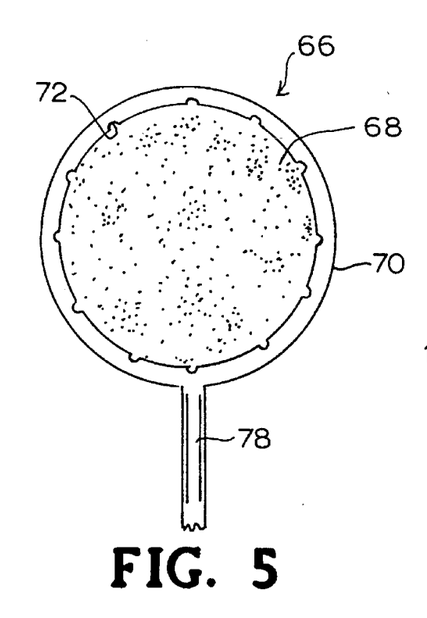
FIG. 5 is a front elevation view of a still further embodiment of a flash vaporization matrix structure.

FIG. 5 is a front elevation view of another flash vaporization matrix structure assembly 66, which features a porous sintered metal disk 68 which about its periphery is circumscribed by a distributor ring 70 having openings 72 on its inner surface. The ring 70 is hollow in its interior to define a flow passage therein. This interior flow passage is in flow communication with the reagent source liquid feed conduit 78, which in turn is joined in closed flow communication to ring 70.

In operation of the FIG. 5 assembly, reagent source liquid is flowed through feed conduit 78 into ring 70 and issues through the inner openings 72 thereof onto the surfaces of the porous sintered metal matrix 68. The sintered metal matrix is maintained at elevated temperature, for vaporization of the reagent source liquid thereon.

Figure 6:
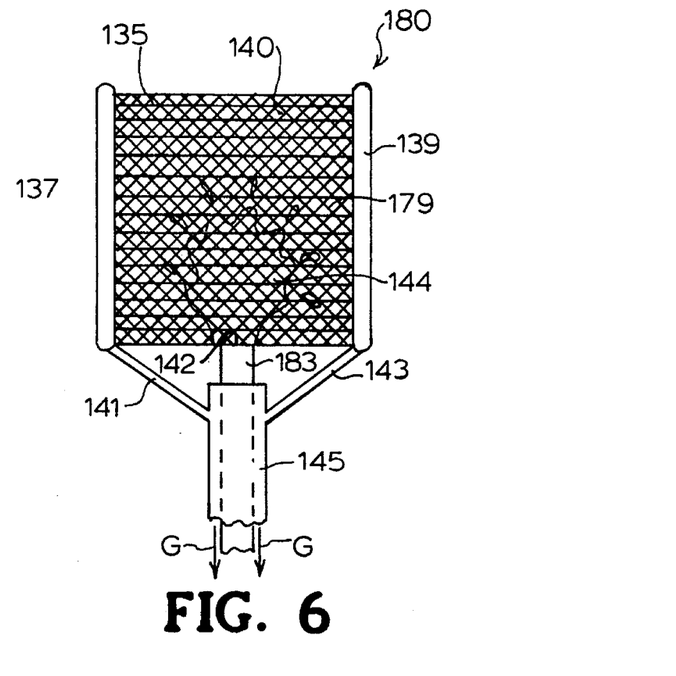
FIG. 6 is a front elevation view of a flash vaporization matrix structure, of a type suitable for use with a carrier solvent having extremely low volatility, and comprising means for recovery and, if desired, recirculation of the carrier solvent.

FIG. 6 is a front elevation view of a flash vaporization matrix structure which may be employed to flash vaporize reagent source liquid comprising a non-vaporized solvent which is recovered for reuse, contemporaneously with the flash vaporization of the involatile reagent from the reagent source liquid introduced onto the vaporization matrix structure.

Referring to FIG. 6, the flash vaporization assembly 180 comprises a vaporization matrix structure 179, which is associated with a reagent source liquid feed conduit 183. The matrix structure 179 may suitably comprise a screen 140 formed of wire mesh elements providing a foraminous member. The matrix structure 179 is attached to the distal end 142 of the reagent source liquid feed conduit 183 in any suitable manner of affixation, to provide fluid flow communication between the interior passage of conduit 183 and the matrix structure 179. By this arrangement, liquid 144 is flowed from conduit 183 onto the surfaces of the screen 140, with the screen being maintained at suitably high temperature, to effect flash vaporization of the involatile reagent source compound from the source liquid comprising same.

The FIG. 6 flash vaporization assembly is particularly adapted for the recovery of a non-vaporized solvent from the source liquid 144, by the provision of transverse wick elements 135. The transverse wick elements extend across the screen 140 and terminate at the margins of the screen, in wicking flow communication with the manifold members 137 and 139, respectively. The manifold members 137 and 139 in turn are connected in liquid flow communication, means of by branch return conduits 141 and 143, respectively, to return conduit 145. As is shown, the return conduit 145 concentrically surrounds the liquid feed conduit 183, to provide an annular flow space therebetween, whereby recovered solvent is returned to the feed reservoir or other collection locus, flowing in the direction indicated by the arrows G.

In operation of the FIG. 6 flash vaporization assembly, liquid 144 is injected by feed conduit 183 onto the surfaces of screen 140, which as indicated is maintained at suitably high temperature to effect flash vaporization of the involatile reagent. The liquid 144, which comprises the involatile reagent in a non-vaporizable solvent, thus is separated into the flashed involatile reagent component, and the non-vaporized solvent which remains on the screen 140, and then is wicked transversely by the wicking elements 135 to the manifolds 137 and 139 at the margins of the screen. Liquid collected in the manifolds 137 and 139 flows by branch lines 141 and 143, respectively, to the return conduit 145 for reuse.

It will be appreciated that other collection means and methods may be employed to recover a solvent from the flashed, or flashing, involatile reagent source liquid, within the broad practice of the present invention.

BaTiO$_3$ and Ba$_x$Sr$_{1-x}$TiO$_3$ thin film have been grown by simultaneous delivery of involatile Ba, Sr and Ti organometallic compounds in a single liquid solution to the film growth reactor. This approach is an extension of liquid delivery of involatile Ba compounds described in an earlier application. Simultaneous delivery of all the cation species to the substrates via a single manifold can be advantageous as compared to separate precursor manifolds in terms of Ba:Ti and Ba:Sr:Ti stoichiometry in the films.

Delivery of multiple reagents in a single liquid injection system is also applicable to CVD growth of other useful thin film materials such as boro-phosphorus-silicate glass (BPSG), Ta$_2$O$_5$, TiO$_2$, and composite films of these and other constituents. This type of approach is very reproducible in terms of film stoichiometry, and represents a significant advance in the state-of-the-art for MOCVD growth of complex oxide materials.

The approach involves transport and flash vaporization of Ba, Sr and Ti MOCVD precursor reagents dissolved in a single solution. The solvent used for transport of the organometallics to the reactor must be capable of being volatilized at a temperature below the decomposition temperature of the precursor reagents and must be a good solvent for the reagents. For example, 90% isopropanol, 10% tetraethylene glycol dimethyl ether (by volume) has been used with good results. The Ba, Sr, and Ti organometallic compounds may be well-known CVD source reagents such as barium bis-tetramethylheptanediaonate (Ba(thd)$_2$), strontium bis-tetramethylheptanediaonate (Sr(thd)$_2$) and titanium bis-isopropoxide-bis-tetramethylheptanediaonate (Ti(OPr)$_2$(thd)$_2$). Typical solute concentrations are 0.1M total for the Group IIa organometallic compounds and 0.1M for the titanium compound. These concentration ratios in the liquid are identical to the desired film stoichiometry, although in general the characteristics of a specific CVD reactor (temperature, pressure, flow, presence of radicals) may require different cation ratios in the precursor liquid. Variation of the Ba/Sr ratio in the film can be achieved by varying the concentrations of the corresponding precursors in solution as appropriate. Such variation may be desirable to modify the temperature-dependent dielectric properties of the film as required for a particular application.

The solution (both solvent and solutes) is delivered onto a heated metal surface or frit and is vaporized there. Highly reproducible delivery can be achieved through use of a syringe pump. The liquid enters the vacuum system through a check valve which opens at pressures greater than atmospheric pressure but below the pressure limit of the syringe pump. Typical liquid flow rate is 4.0 ml/hour. The metal surface is a ¼" diameter ⅟₁₆" thick stainless steel frit with 20 micrometer pore size, which has a large surface area. The porous disk is held at 230° C. The liquid can then wet this surface in a thin layer. The solvent evaporates, and the small volume of solute left there can sublime, and be carried, as a vapor, into the reactor and to the substrate by the Ar flowing through the vaporization region. Argon flows through the porous disk in the same direction as the liquid, to facilitate transport of the vapor phase solvent and organometallics into the reactor. Typically, the flow of the Ar carrier gas is 100 sccm.

A small volume of the source reagent is therefore kept at the sublimation temperature for a very short time, effectively preventing premature decomposition. Premature decomposition at temperatures near the sublimation temperature is a major shortcoming typical of Ba and Sr organometallics This flow-wetting-evaporation/sublimation sequence takes place on a continuing basis, i.e., liquid flow is continuous. Efficient sublimation of the deposited solute is a critical characteristic which depends on the metalorganic compounds used as the reagent and on the temperature of the metal surface where the liquid is incident. Pressure gradients in the region of the vaporization zone are also important. Control of the vaporization zone temperature and temperature gradients is not trivial because of the strong cooling effect of the solvent evaporation.

Figure 7:
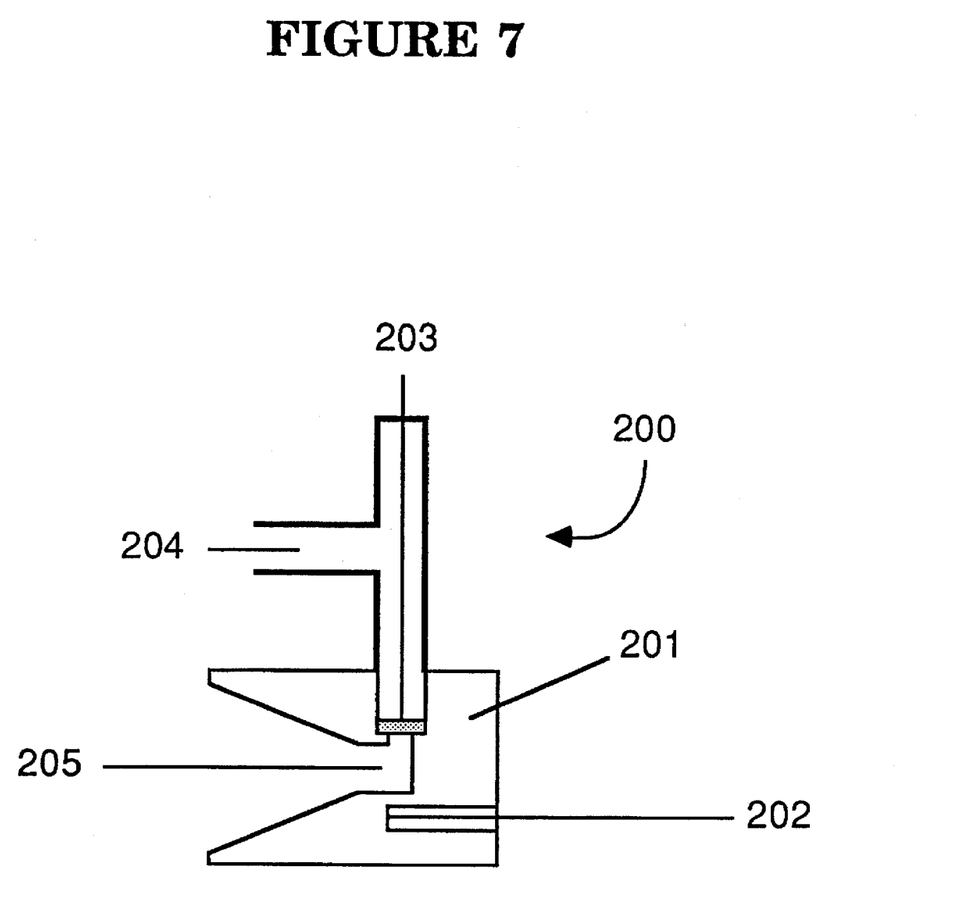
FIG. 7 is a schematic of a vaporization zone.

A schematic of the vaporization zone 200 is shown in FIG. 7. The main body of the apparatus is a 1" diameter stainless steel cylinder 201 which has been machined as shown in this cross-sectional view. Since the thermal conductivity of the stainless steel block is relatively poor, an axially symmetric aluminum jacket (not shown) is clamped around the stainless steel cylinder, and is heated uniformly by resistive heaters clamped in the aluminum. A thermocouple 202 imbedded near the porous frit 203 is used to measure temperature, which is controlled by a proportional controller that powers the heaters. Carrier gas flows in inlet 204 and reagent-laden gas flow to the reactor via port 205.

The Ba and Ti carrying gas enters the vertically oriented reactor at the bottom. At this point oxygen is also entering the reactor, at 100 sccm. Total pressure at the substrate is approximately 0.5 torr, although use of the liquid delivery apparatus described above can be for film growth at any pressure. The relative partial pressures of Ti, Sr and Ba at the substrate are controlled by varying the pumping rate of the solution and the concentration of the metalorganic species in the solution.

Figure 8:
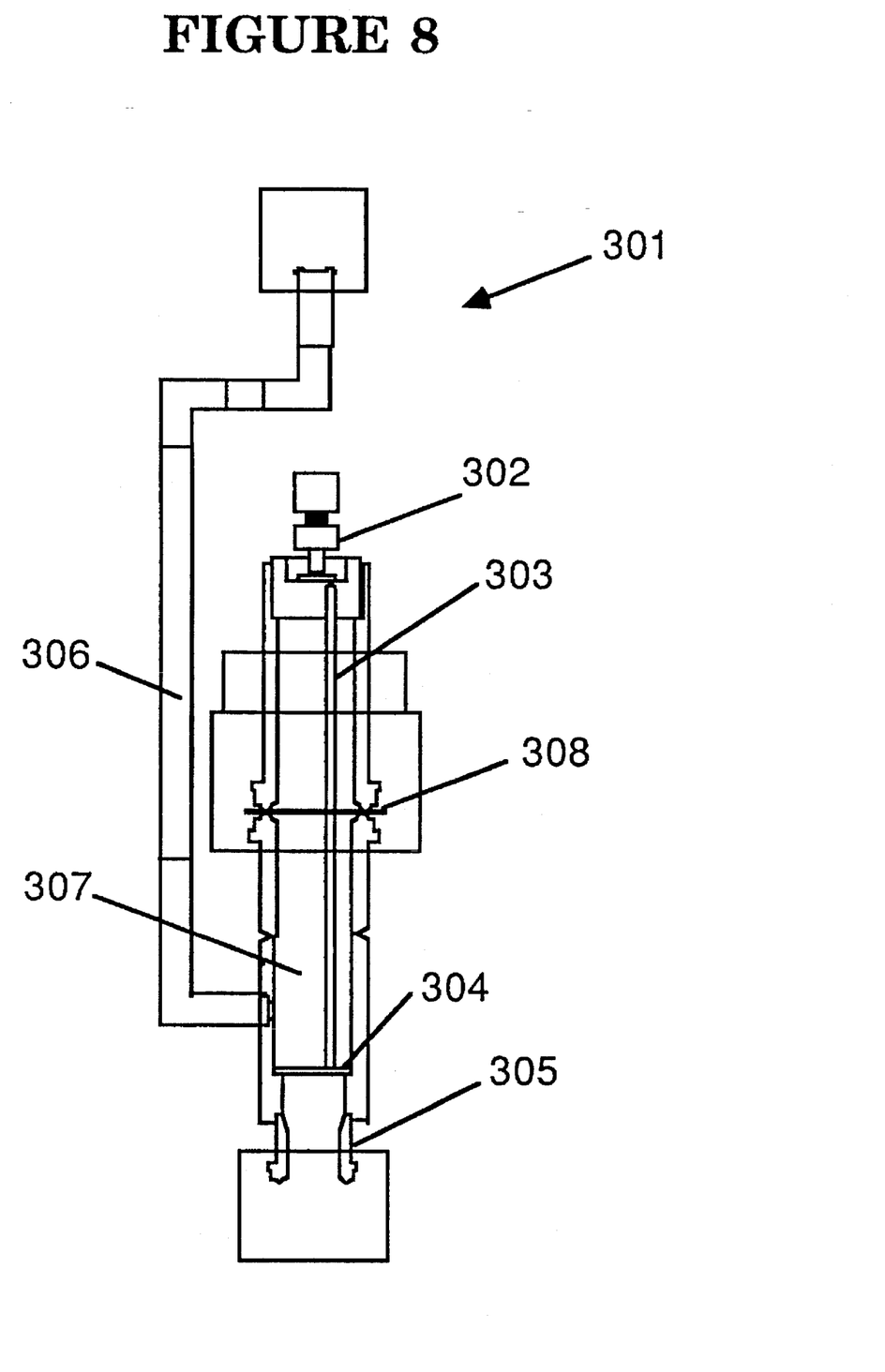
FIG. 8 shows a cross-sectional view of a delivery system for flash vaporizing a source reagent.

FIG. 8 shows another useful configuration of the delivery system 301 for flash vaporizing a source reagent or source reagent solution. In this configuration, a liquid reagent or reagent solution is pumped through fitting 302 into tube 303, whence it flows onto porous frit 304 which is heated to a temperature sufficient to flash vaporize the reagent. Reagent gases then flow downstream to the reactor via port 305. Inert carrier gas such as nitrogen or argon is flowed into chamber 307 via tube 306. The inner diameter and length of tube 303 can be varied in order to control the pressure drop between fitting 302 and the downstream reactor. It is desirable to hold the pressure drop constant so that the rate of pumping reagent into the system can be used to control the rate of reagent delivery into the reactor. The inner diameter of tube 303 can range from $1 \times 10^{-4}$ to $20 \times 10^{-4}$ inches, preferably $4 \times 10^{-4}$ to $10 \times 10^{-4}$ inches. The number of these tubes can range from 1 to 3. The type of pump used can be of any kind capable of delivering a constant stream of reagent liquid. Piston pumps of the type used in high performance liquid chromatography are suitable. The heated frit may be made of any material that is inert in the presence of the reagents at the appropriate temperatures. Stainless steel, glass, and ceramics are suitable materials of construction. The frit may have pore size of from 2 to 200 μm, with 10 to 20 μm being preferred. A gasket 308 enables the system to be disassembled easily for cleaning.

It will be recognized that the vaporization matrix may be provided in a structural form which can be widely varied, depending on the nature of the liquid to be flash vaporized thereon, and the operating conditions and end use application for the reagent material of interest. Thus, for example, the flash vaporization matrix structure could comprise a permeable housing or "cage" filled with tiny particulate packing elements providing extending surface area, for flash vaporization of reagent source liquid solution introduced thereonto when the packing material is maintained at elevated temperature.

Alternatively, the structure of the flash vaporization matrix may embody a wick element serving to draw reagent source liquid onto its surfaces from an associated liquid feed conduit by capillary action.

Accordingly, the term "flash vaporization matrix structure" is to be broadly construed to include all suitable physical structures comprising physical element(s) which are arranged to receive a liquid (reagent thereon to vaporize the received liquid when the physical element(s) are heated to a sufficiently high flash vaporization temperature for the specific liquid employed.

The flash vaporization matrix structure may be maintained at suitably high elevated temperature to effect flash vaporization of the reagent source liquid thereon in any suitable manner. For example, the matrix structure may be maintained at elevated temperature by viture of convective heat transfer from an elevated temperature carrier gas flowed past the structure, so that the sensible heat of the flowing gas stream is employed to maintain the flash vaporization matrix structure at a desired temperature level.

Alternatively, the matrix structure may be provided with a suitable source of heating energy, such as means for infrared (IR) heating of the structure, e.g., an IR lamp disposed proximate to the first fluid flow passage in the vicinity of an IR-transmissive window in the first fluid flow passage, so that radiant IR energy is transmitted therethrough to heat the matrix structure.

Alternatively, the matrix structure itself may be a resistance heating element in an electrical circuit therefor, such as where the matrix structure is formed of a suitable metal or other material capable of being resistance heated.

The choice of specific heating modality for the flash vaporization matrix structure will depend on the reagent source liquid, carrier gas, and other species employed, as well as the form and material of construction of the matrix structure itself. Suitable heating arrangements may readily be determined in a specific end use application by those of ordinary skill in the art, without undue experimentation.

The features and advantages of the present invention are more fully shown with respect to the following non-limiting examples, wherein all parts and percentages are by weight unless otherwise expressly stated.

EXAMPLE I

An isopropanol solution of $Ba(fod)_2$ and $Ca(fod)_2$ is made up, containing 4% by weight of the barium reagent and 4% by weight of the calcium reagent, based on the weight of solvent in the solution. The resulting barium/calcium reagent solution is employed at ambient temperature (approximately 25° C.) and injected into the first fluid flow passage of a delivery system of the type which is schematically shown and described with reference to FIG. 1 hereof.

The barium reagent, calcium reagent and isopropanol were vaporized and carried into the reactor to form a layer of barium fluoride/calcium fluoride ($BaF_2/CaF_2$) on a silcon substrate. The vaporization zone temperature in the delivery system was maintained at approximately 250° C. The carrier gas was argon, at a flow rate of 100 cubic centimeters per minute ($cm^3$/min.). These conditions ensured that flash vaporization was achieved.

The barium and calcium concentrations inside the deposition reactor were controlled by varying the rate of addition of the isopropanol reagent solution and/or the molarity of the reagent solution. These flash vaporization techniques prevented the premature decomposition of the barium and calcium reagents, since the related complexes were at their vaporization temperatures only for a brief instant rather than for the entire time period of the deposition run, which was on the order of 4 hours. As a consequence, the partial pressure of the Group II reagents inside the reactor remained constant, and the barium fluoride/calcium fluoride stoichiometry and delivery were closely controllable to provide a desired layer thereof on the substrate.

EXAMPLE II

Using a reagent delivery system of the type shown in FIG. 1 hereof, $SrF_2/CaF_2$ films were deposited on Si(100) at a substrate temperature of 500° C. and reactor pressure of 1 torr. MOCVD was carried out with an oxygen to argon ratio of 1; however, no carbon was observed by EDS (sensitivity ca. 1%) at ratios ranging from 0.1 to 2. The as-deposited films were polycrystalline and a linear relationship was observed between the total growth rate and the delivery rate of the Group II organometallic sources, which indicate that mass transfer limited growth was achieved. Under these conditions the relative molar concentrations of the Sr and Ca in the film were directly proportional to their molar ratio in the inlet stream; fluorine was identified by EDS analysis.

EXAMPLE III

A delivery system of the type schematically shown in FIG. 2 hereof was employed to deliver strontium and calcium source reagents to the deposition reactor in the MOCVD of BiSrCaCuO HTSC films.

The bismuth source reagent was bismuth ethoxide, $Bi(OC_2H_5)_3$, the calcium and strontium source reagents were calcium and strontium bis(2,2-dimethyl-6,6,7,7,8,8,8-heptafluoro-3,5-octanedionates), and the copper source reagent was copper bis(hexafluoroacetylacetonate). MOCVD of BiSrCaCuOF was carried out at 500° C. and 2 torr at an oxygen to argon ratio of 1. The reactor parameters are set out in Table I below.

TABLE I

| Run No. | Delivery Rate (mmol/min) | | Carrier Flow Rate ($Cm^3$/min) | | Growth Rate (mg/min) | Stoichiometry |
|---|---|---|---|---|---|---|
| | Ca | Sr | Bi | Cu | | |
| 1* | 46.1 | 33.0 | 50 | 70.4 | 54.7 | — |
| 2 | 38.3 | 27.4 | 25 | 44 | 22.6 | — |
| 3 | 511 | 366 | 25 | 38 | 37.3 | 2-4.5-2.4-3.7 |
| 4 | 210 | 238 | 25 | 32 | 31.5 | 2-1.5-1.0-2.8 |
| 5 | 287 | 325 | 25 | 32 | 33.3 | 2.2.4-1.9-3.8 |
| 6 | 257 | 291 | 25 | 24 | ** | 2-2.4-2.1-3.0 |
| 7 | 296 | 336 | 25 | 24 | 33.2 | 2-2.4-2.5-3.8 |
| 8 | 295 | 335 | 30 | 30 | 33.6 | 2-5.9-2.9-5.6 |
| 9 | 286 | 325 | 25 | 24 | ** | 2-2.1-1.9-2.2 |
| 10 | 290 | 329 | 25 | 24 | ** | — |
| 11 | 299 | 339 | 25 | 24 | ** | 2-11-6.8-6.7 |
| 12 | 295 | 335 | 30 | 30 | ** | 2-4.4-3.6-3.5 |

\# Bismuth bubbler held at 180° C., copper bubbler held at 60° C., substrate is Si(100).

§ Normalized to the area of a 2 in diameter silicon wafer (20.3 $cm^2$).

\* Reactor pressure was 4 torr, Bi bubbler at 180° C.

\*\*Pt and Pt/W fiber substrates

The growth rate under these conditions was 0.5 to 1 microns/hour.

The BiSrCaCuO/MgO(100) films were annealed by the following sequence of steps:

1.) heating to 870° C. at 30° C./minute in flowing oxygen saturated with water at 20° C.;

2.) holding the temperature at 870° C. for 2 hours in wet oxygen; switching the flow of water off and maintaining the oxygen flow for an additional 3hours; and 3.) cooling to room temperature in flowing oxygen at 30° C./minute.

The post annealed films are nearly smooth with an average grain size of 6 to 10 microns. The resistive transitions have onsets of 110° K. and are fully superconducting by 80° K. Energy dispersive X-ray analysis indicates that all the fluorine has been removed by this treatment. The high transition temperature and planar morphology are indicative of c-axis oriented growth.

EXAMPLE IV

A solution of barium bis(2,2,6,6-tetramethyl-3,5-heptanedione), at a concentration of 0.6 g Ba/100 cc solution, is pumped onto a metallic surface that comprises the flash vaporization zone for the barium source compound. The temperature of this vaporization surface is measured with a thermocouple, and held at 220° C. This region is in the Ti manifold, where $Ti(OP)_4$ is carried by dry argon gas at 100 sccm. The molar fraction of Ti in this gas is controlled by using a throttle valve in the manifold to adjust the total pressure at the $Ti(OP)_4$ bubbler. The bubbler is held at 50° C. The Ti manifold is maintained at 100° C. to prevent condensation of the Ti reagent.

The Ba and Ti carrying gas enters the vertically oriented reactor at the bottom. At this point oxygen is also entering the reactor, at 10 sccm. Total pressure at the substrate is approximately 1.0 torr. The relative partial pressure of Ti and Ba at the substrate are controlled by varying the pumping rate of the barium source compound solution and the total pressure at the Ti(OP)$_4$ bubbler.

Si [100] and SrTiO$_3$[100] substrates are used for film growth. The substrate temperature is 850° C. It is heated by contact with a SiC susceptor, which is inductively heated by a 400 KHz EMF, originating in coils outside the reactor. Film growth duration is typically 1 hour; reactor evacuation, purge sequences, heat up and cool down make the entire growth process last about 3 hours.

The films are characterized by SEM/EDS and XRD. The former is used to determine growth morphology and approximate stoichiometry. The latter is used to determine crystalline phases present, including their orientation and in both cases, a-axis oriented BaTiO$_3$ are formed.

EXAMPLE V

Pt coated substrates have been used for growth of BaTiO$_3$ and Ba$_x$Sr$_{1-x}$TiO$_3$ thin films. The substrate temperature is 600° C. It is heated by contact with a SiC susceptor, which is illuminated by a 600W quartz-halogen lamp. Film growth duration is typically 1 hour.

The films are characterized by scanning electron microscopy (SEM), energy dispersive spectroscopy (EDS), x-ray diffraction (XRD) and infrared reflectance, as well as electrical measurements of dielectric constant and current-voltage characteristics. SEM and EDS are used to determine growth morphology and approximate stoichiometry. XRD is used to determine crystalline phases present, including their orientation. Electrical properties are measured to assess the usefulness of these films for dynamic random access memories (DRAMs), although ferroelectric perovskite thin films are useful for nonvolatile ferroelectric memories, pyroelectric detectors and electro-optic phase modulators, for example.

The Pt film system used in this effort was: Pt/Ti/ONO/Si [100]. ONO stands for a SiO$_2$/Si$_3$N$_4$/SiO$_2$ trilayer that prevents diffusion of Si into the Ti layer. The BaTiO$_3$ growth process for Pt was unchanged from the process used for Si (Example 3). Film growth was done at two substrate temperatures, 525° and 600° C. and at two plasma powers: 10W and 0W.

The IR specular reflectance for films grown at 525° C. using a thermal process and a 10W plasma are shown in FIG. 2a; an uncoated Pt film was used as the standard. Spectral features again are present at 1415 cm$^{-1}$, in this case showing decreased reflectance at peak absorption rather than increased reflectance as was observed for the films grown on bare Si. This difference is due to the optical properties of the substrates. The reflectance of the Pt "substrate" is relatively high (>98%) with the result that reflectance of these samples is quite sensitive to absorption. For this reason it is difficult to directly compare absorption results from different substrates; however, it is clear that both films grown at 525° C. have a strong absorption due to CO$_3$ and that the concentration of this specie is decreased by about 3 with the remote O$_2$ plasma.

Raising the substrate temperature to 600° C. decreased the spread in the CO$_3$ content between the thermal and 10W plasma processes. Specular reflectance data for these films showed that increased substrate temperature allowed thermal activation to compete more effectively with the dissociation of O$_2$ by the plasma. There also exists some spectral structure in the 500–800 cm$^{-1}$ region. An IR active phonon mode E(TO) for single crystal BaTiO$_3$ exists at approximately 520 cm,$^{-1}$ [1] but meaningful characterization is impossible due to the lack of long range order and small interaction volume in the films (the films are microcrystalline of approximately 0.6 mm thickness) resulting in spectrally broad and fairly low absorption.

[1] M. DiDomenico, S. H. Wemple, S. P. S. Porto, Phys. Rev., 174, 522 (1968)

X-ray diffraction was measured in the Bragg-Brentano geometry for the films grown on Pt and no crystalline phases were detected in either film grown by the thermal process. The films grown using the 10W plasma process at 525° C. and 600° C. were found to be amorphous and polycrystalline BaTiO$_3$, respectively. The amorphous films are characterized by a broad diffraction peak at 30°–32° and a bulge in the baseline between 40° and 50°; the peaks near 40° and 46° arise from the Pt. It is notable that although BaCO$_3$ was observed by IR reflectance, crystalline BaCO$_3$ is not detected. The films grown by PE-MOCVD at 525° C. had fairly smooth yet uneven surfaces; we speculate that film density is reduced by the presence of CO$_3$ in the film. Films grown at 600° C. are made up of a homogeneous, tightly packed system of crystallites less than 2000Å in diameter and the surface roughness is approximately 100Å RMS. These films show bright interference colors but are hazy when viewed with a bright light from outside the plane of incidence due to scattering from the grain boundaries. The polycrystalline films have partial texture in the [100] direction. Presence of the [110] line in the spectrum (the strongest line in randomly oriented material) indicates that the texture is not complete. The diffraction line at 45.3° does not display splitting expected for non-degenerate [200] and [002] lattice spacings expected for tetragonal crystal system. The fine grain size of the films may be responsible for suppression of the tetragonal structure at room temperature, characterized as the 'superparaelectric' phase for fine-grained perovskites. This structure should have flat temperature dependence of the dielectric constant. Temperature dependent electrical and crystallographic properties are being investigated and will be reported in a future communication.

Dielectric properties were measured at 100 kHz with an HP 4192A impedance analyzer using evaporated gold contacts and the Pt base layer as the top and bottom electrodes, respectively. DC conductivity was measured using a Keithley 617 electrometer. Ferroelectricity was characterized using a computer controlled modified Sawyer-Tower circuit. Data for films grown using 10W PE-MOCVD are shown below. Dielectric properties were measured at 100 kHz.

| Growth temperature | Structure | Dielectric constant | Loss tangent | DC resistivity | Ferro-electricity |
| --- | --- | --- | --- | --- | --- |
| 525° C. | amorphous | 30 | 0.04 | $10^8$ Ω-cm | absent |
| 600° C. | perovskite | 300 | 0.02 | $5 \times 10^8$ Ω-cm | slight |

The PE-MOCVD films have high resistivity, indicating complete oxygenation. DC resistivity for the polycrystalline film is 5×10$_8$ W-cm., which was determined from current vs. voltage measurements. The dielectric constant of the amorphous $BaTiO_3$ films is very low compared to ceramic powder, although this is typical of amorphous material and indicates lack of long-range atomic order in the films. The polycrystalline films have dielectric constants as large as 300. This value is low compared to ceramic $BaTiO_3$ although it is 100 times that of $SiO_2$. If these properties can be maintained at film thicknesses less than 1000Å it will allow the area of $BaTiO_3$ capacitors in DRAMs to be reduced by a factor of 10 relative to state-of-the-art ONO capacitors at constant total stored charge.

In addition to the $BaTiO_3$ films described above, the liquid delivery system has recently been used for growth of $Ba_xSr_{1-x}TiO_3$. XRD of a film that is 50:50 Ba:Sr showed that the perovskite phase was present as shown by the 100, 110 and 200 reflections in the spectrum. Pairs of index lines near these directions correspond to JCPDS Card files for $BaTiO_3$ (smaller angle-larger d-spacing) and $SrTiO_3$ (larger angle-smaller d-spacing). The [110] reflection displays no splitting, and has an angular location midway between the predicted [110] d-spacings for $BaTiO_3$ and $SrTiO_3$, as expected.

EXAMPLE VI

Tantalum oxide ($Ta_2O_5$) films were grown using the delivery system shown in FIG. 8. 100% Tantalum ethoxide reagent was pumped at a rate between 0.01 and 0.2 mL per minute into a vaporization zone which was held at 165° C. The reagent flash evaporated and was carried into a cold trap by a stream of the inert carrier gas argon. The molar fraction of tantalum ethoxide in the gas phase was controlled by varying the volume per unit time of reagent delivered into the vaporizer or varying the carrier gas flow, or a combination of these. The stability of tantalum ethoxide vapor delivery was calculated by measuring the pressure rise in the system downstream of the vaporizer resulting from the introduction of tantalum ethoxide vapor. The standard deviation of the pressure increase, and hence vapor concentration, was 3.5%.

EXAMPLE VII

YBCO (YBaCuO) films were deposited by a delivery system of the general type shown and described with reference to FIG. 7 herein, with the three (Y, Ba, Cu) reagents being simultaneously delivered for deposition to the deposition reactor. The metalorganic complexes $(M(thd)_n, M=Y, Ba, Cu)$ were dissolved in an organic solution, and injected in the hot zone immediately upstream of the reactor inlet, with flash vaporization of the injected reagent solution. $M(thd)_n$ was chosen as having relatively higher volatility and absence of fluorine contamination relative to more volatile fluorinated complexes. The organic solution was a mixture of tetrahydrofuran (THF), isopropanol (IPA), and tetraglyme, wherein the solution ratio of THF:IPA:tetraglyme was 8:2:1 and the molarity was 0.4 mol/l. There is evidence that THF may be usefully employed to stabilize $Ba(thd)_2$ in MOCVD, and THF may function similarly to tetraglyme in the vapor phase, i.e., saturating the coordination sphere of $Ba(thd)_2$ to prevent oligomerization/decomposition of $Ba(thd)_2$. The addition of IPA serves two purposes: (1) reducing the amount of carbon per unit volume of solution, and (2) lowering the evaporation rate (the STP boiling point of THF is 69° C. and of IPA is 82° C.). Tetraglyme also serves two functions: (1) lowering the evaporation rate (the STP boiling point of tetraglyme is 275° C.), and (2) increasing the stability of $Ba(thd)_2$ during evaporation.

The metal complexes and organic solution were vaporized and carried into the reactor inlet. Film composition was controlled by varying the molar ratio of the complexes in the solution. No decomposition of the source reagents occurred because the source reagents were at their vaporization temperature for only an instant rather than the entire period of the deposition run. (Ca.1hr). Consequently, the partial pressure of all the source reagents remained constant during the growth process. The single solution method dramatically simplified the CVD process and significantly improved process reliability and reproducability.

YBCO films were prepared by PEMOCVD using the aforementioned solution and the delivery system of the general type shown and described with reference to FIG. 7 herein. The deposition conditions were as follows: substrate=MgO; solution=$M(thd)_n$, M=Y, Ba, and Cu) in a mixture of THF, IPA, and tetraglyme, molarity=0.4; deposition temperature=700° C.; vaporization matrix (frit) temperature=220° C.; plasma power=100 watts; carrier gas flow rate=20 sccm; oxidant flow rate=250 ($N_2O$) and 500 ($O_2$); and chamber pressure=approximately 4 torr.

The film composition was slightly copper-rich, with single-phase, highly c-axis oriented 1-2-3 phase present in the as-deposited form. The film was smooth and shining, and evidenced improved morphology as compared to films deposited from separate reagent introduction. Four probe resistivity measurement showed the resistivity of the film began to drop above 90° K., with $T_{co}$ at 88° K.; inductive screening measurement showed superconducting transition at approximately 90° K.

EXAMPLE VIII

High quality YBCO films were grown in situ on $LaAlO_3$ (100) by plasma-enhanced metalorganic chemical vapor deposition (PEMOCVD). The metalorganic complexes ($M(thd)_n$, M=Y, Ba, Cu) were dissolved into an organic solvent of the following composition: 8:2:1 (THF:IPA:tetraglyme), and injected into a vaporization unit of the general type shown and described herein with reference to FIG. 7 hereof, immediately upstream of the reactor inlet. A mixture of $N_2O$ and $O_2$ was used as the reactant gas and the total reactor pressure was 1.5 torr. The single solution method afforded the same process advantages as noted in Example VII. X-ray diffraction measurements indicated the formation (in situ) of single-phase, highly c-axis oriented $YBa_2Cu_3O_{7-x}$ wherein x<0.1, at a substrate temperature of 680° C. The as-deposited films ranged from 0.1 to 0.5 micron in thickness and had mirror-like surfaces. Continuous dense films were indicated by SEM analysis. Both four probe resistivity and inductive measurements showed the deposited films to achieve zero resistivity at about 90° K. and $\Delta T_c < 1°$ K.

Critical current density $J_c$ at 77 K derived from magnetic measurement was $10^6 A/cm^2$. A 1.2 cm long, 10μm wide $YBa_2Cu_3O_{7-x}$ transmission line yielded a $J_c=6\times10^5 A/cm^2$ at 77K.

While the invention has been described with reference to specific aspect, features, and embodiments thereof, it will be apparent that various modifications, variations, and embodiments are possible, and accordingly the invention is to be broadly construed with respect to all such modifications, variations, and embodiments as being within the spirit and scope of the invention.

What is claimed is:

1. A liquid delivery system for delivery of an initially liquid reagent in vaporized form to a chemical vapor deposition reactor arranged in vapor-receiving relationship to the liquid delivery system, said liquid delivery system comprising:

(a) an elongate fluid flow passage defining a longitudinal axis and bounded by an enclosing wall to define a cross-section of the fluid flow passage transverse to the longitudinal axis;

(b) a thin flat porous vaporization element,
 (i) having pores in the range of 2 to 200 micrometers,
 (ii) having a surface to volume ratio of at least 4, and
 (iii) positioned in the fluid flow passage transverse to the longitudinal axis and extending over the cross-section of the fluid flow passage to an outer periphery at the enclosing wall;

(c) means for heating the thin flat porous vaporization element to elevated temperature for vaporization of said liquid reagent;

(d) passage means for delivering a stream of said liquid reagent onto the surface of said porous vaporization element so that the reagent liquid wets the surface of the porous vaporization element in a thin layer of the liquid reagent and is vaporized on said surface when heated by said heating means (c); and (e) means for discharging vapor formed by vaporization of reagent liquid on the porous vaporization element, from the fluid flow passage for passage to the chemical vapor deposition reactor.

2. A liquid delivery system according to claim 1, wherein the passage means for delivering a stream of said liquid reagent onto the surface of said porous vaporization element comprise a liquid reagent delivery conduit longitudinally extending along the elongate fluid flow passage and terminating at the surface of the porous vaporization element.

3. A liquid delivery system according to claim 1, wherein the porous vaporization element comprises a sintered disk formed of a material selected from the group consisting of metal, glass and ceramics.

4. Apparatus for forming films or layers on a substrate from a source reagent vapor derived from an initially liquid reagent, comprising:

a chemical vapor deposition reactor; and a liquid deliver system arranged in vapor feeding relationship to the chemical vapor deposition reactor, for delivery of the initially liquid reagent in vaporized form to the chemical vapor deposition reactor.

said liquid delivery system comprising:

(a) an elongate fluid flow passage defining a longitudinal axis and bounded by an enclosing wall to define a cross-section of the fluid flow passage transverse to the longitudinal axis;

(b) a thin flat porous vaporization element,
 (i) having pores in the range of 2 to 200 micrometers,
 (ii) having a surface to volume ratio of at least 4, and
 (iii) positioned in the fluid flow passage transverse to the longitudinal axis and extending over the cross-section of the fluid flow passage to an outer periphery at the enclosing wall;

(c) means for heating the thin flat porous vaporization element to elevated temperature for vaporization of said liquid reagent;

(d) passage means for delivering a stream of said liquid reagent onto the surface of said porous vaporization element so that the reagent liquid wets the surface of the porous vaporization element in a thin layer of the liquid reagent and is vaporized on said surface when heated by said heating means (c); and (e) means for discharging vapor formed by vaporization of reagent liquid on the porous vaporization element, from the fluid flow passage for passage to the chemical vapor deposition reactor.

* * * * *

UNITED STATES PATENT AND TRADEMARK OFFICE
CERTIFICATE OF CORRECTION

PATENT NO. : 5,536,323

DATED : July 16, 1996

INVENTOR(S) : Peter S. Kirlin, et al.

It is certified that error appears in the above-indentified patent and that said Letters Patent is hereby corrected as shown below:

Column 22, line 7, change "liquid deliver" to --liquid delivery--.

Signed and Sealed this

Thirty-first Day of December, 1996

*Attest:*

BRUCE LEHMAN

*Attesting Officer*     Commissioner of Patents and Trademarks